United States Patent [19]

Gopinath et al.

[11] 3,971,998
[45] July 27, 1976

[54] RECURSIVE DETECTOR-OSCILLATOR CIRCUIT

[75] Inventors: Bhaskarpillai Gopinath, Berkeley Heights, N.J.; Robert Paul Kurshan, New York, N.Y.

[73] Assignee: Bell Telephone Laboratories, Incorporated, Murray Hill, N.J.

[22] Filed: May 2, 1975

[21] Appl. No.: 574,028

[52] U.S. Cl............................... 328/167; 328/37; 307/221 D; 307/295; 329/126; 333/18
[51] Int. Cl.² .................. H04B 15/00; H03B 1/04
[58] Field of Search.................. 328/37, 167, 165; 307/221 D, 295; 329/126; 333/18

[56] References Cited
UNITED STATES PATENTS

| | | | |
|---|---|---|---|
| 3,490,049 | 1/1970 | Choquet et al. | 329/126 |
| 3,546,490 | 12/1970 | Sangster | 307/295 X |
| 3,654,563 | 4/1972 | Hesler et al. | 328/167 |
| 3,718,863 | 2/1973 | Fletcher et al. | 328/37 |
| 3,723,911 | 3/1973 | Forney | 333/18 |
| 3,740,591 | 6/1973 | Butler et al. | 307/295 |
| 3,912,916 | 10/1975 | Grun et al. | 328/167 X |

OTHER PUBLICATIONS
IBM Tech. Disclosure Bul., p. 183, vol. 7, No. 3-8/1964, "Adjustable Digital Matched Filter," by Blasbalg et al.

Primary Examiner—John S. Heyman
Attorney, Agent, or Firm—H. L. Logan

[57] ABSTRACT

Disclosed is a recursive circuit capable of serving as a signal detector or as a signal generator. The circuit comprises a shift register capable of storing multilevel signals, and a feedback network responsive to an input signal and to the output signals of selected stages of the shift register. In the feedback network, the output signals of the selected stages are each multiplied by prechosen integers, and then added with the input signal to form a sum signal which is applied to the first stage of the shift register. The sum signal is developed by nonmodulo addition, and the multiplying integers are prechosen to cause the characteristic function of the circuit to be a cyclotomic polynomial. Detection of the presence in the input signal of a signal having a chosen frequency is accomplished by the sum signal excluding a predetermined threshold level. Signal generation is accomplished by presetting the register to a nonzero state and allowing the output signal to develop in accordance with the characteristic function of the circuit.

14 Claims, 4 Drawing Figures

RECURSIVE DETECTOR-OSCILLATOR CIRCUIT

BACKGROUND OF THE INVENTION

1. Field of the Invention

This invention relates to signal processing circuits.

2. Description of the Prior Art

An "infinite Q circuit" is a description that is normally associated with a circuit characterized by a pole in the frequency domain that is located exactly on the jω axis. As a consequence of this pole location, an infinite Q circuit responds to an input signal of a unit impulse by developing sinusoidal oscillations of constant amplitude at the frequency of the circuit's pole. If a source of energy is available in the circuit for replenishing withdrawn power, the circuit can serve as a single-frequency oscillator.

As a further consequence of the pole location, an infinite Q circuit responds to a continuous input signal by developing an output signal that is continually increasing with time when the applied input signal is of a frequency equal to the frequency of the circuit's pole. The infinite Q circuit, thus, is a tuned filter, and can serve as a signal detector.

In practice, sine wave analog oscillators are generally designed to possess a frequency domain pole that is slightly to the right of the jω axis to assure continued oscillation. Unfortunately, a pole located to the right of the jω axis causes the oscillator's output signal to increase in magnitude until circuit nonlinearities prevent a further magnitude increase. These nonlinearities distort the output signal and thereby introduce unwanted harmonics.

Digital oscillators generally use binary arithmetic in combination with various forward acting and backward acting feedback paths. Because of the finite capacity of conventional arithmetic digital circuits, however, truncation of signals must occur. The truncation causes distortions in the output signal, with results similar to those of analog oscillators.

Similar practical problems exist in the filter art. Analog filters suffer from the instabilities and inaccuracies characteristic of all analog circuits, and digital filters require relatively large storage capacity in order to assure proper sensitivity and selectivity of the filter and proper safeguard against computation errors which cause undesirable limit cycles.

SUMMARY OF THE INVENTION

It is an objective of this invention to efficiently and accurately detect signals of predetermined frequency.

It is another objective of this invention to generate signals of predetermined frequencies.

It is still another objective of this invention to employ a recursive circuit which employs error free arithmetic, and to thereby operate on signals without accumulating errors.

These and other objectives are achieved by employing a recursive circuit which behaves as an infinite Q circuit. Structurally, in one embodiment of this invention the circuit comprises delay elements interconnected in the form of a shift register, a set of multipliers connected to multiply the output signals of selected delay elements by predetermined integers, and a non-modulo adder for summing the multiplied signals and an input signal and for applying the resulting sum signal to the first delay element of the shift register. The particular shift register delay elements selected and the particular multiplying integers chosen are designed to provide a characteristic function for the circuit that is a cyclotomic polynomial.

In another embodiment of this invention, the circuit further comprises a transversal network connected to selected elements of the shift register. The transversal network is designed to have transmission zeroes in the frequency domain, at the frequencies of unwanted spurious resonances which are inherent in the embodiment mentioned above.

When an embodiment of this invention is used to detect the presence of a signal of a particular frequency in an input signal, the sum signal is compared to a fixed threshold. Exceeding of the threshold within a prescribed time interval indicates the presence of the particular frequency within the input signal. The input signal may be hard limited without adversely affecting the operation of the signal detector.

When an embodiment of this invention is used to generate signals, a nonzero state must be established in the shift register's delay elements in order to produce oscillations. The magnitude of oscillations is a function of the initial state of the shift register.

DETAILED DESCRIPTION

Figure 1:
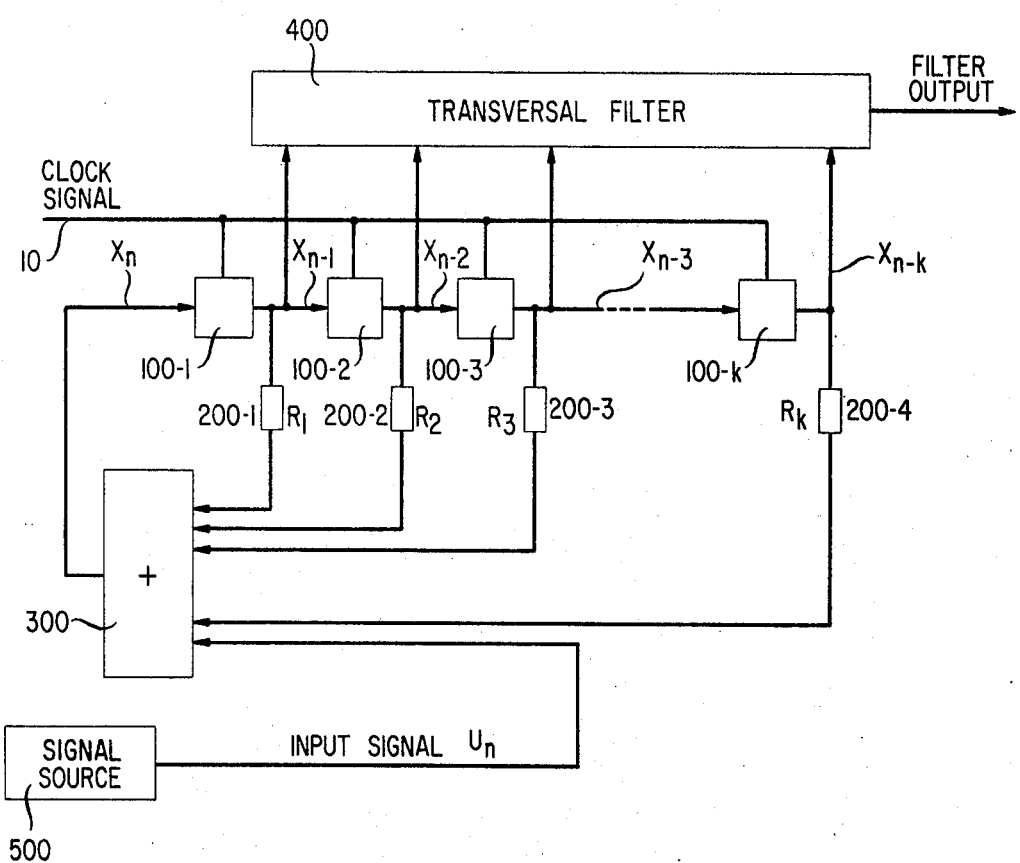
FIG. 1 depicts the general block diagram of a circuit embodying this invention.

FIG. 1 depicts the general block diagram of a circuit embodying this invention. Throughout most of the specification, the circuit of FIG. 1 is viewed as a signal detector. This aids in the understanding of the circuit's theory of operation. The circuit of FIG. 1 can easily serve, however, as a signal generator capable of generating a sinusoidal output signal having a high degree of spectral purity.

In FIG. 1, elements 100-1, 100-2, 100-3, . . . 100-k, are multilevel delay stages interconnected in cascade to form a shift register, clocked with a clock signal of period τ applied on lead 10. These delay elements may, for example, be charge coupled diodes (CCD) delay elements. Elements 200-1, 200-2, 200-3, . . . 200-k, are modulating elements. One lead of each modulating element 200-i is responsive to the output signal of a delay stage 100-i, and the other lead of each modulating element 200-i is connected to a summer 300. Elements 200-1 through 200-k are named "modulating elements" because they modify the output signals of elements 100-1 through 100-k via a multiplication process. This multiplication process may involve multiplication by positive or negative quantities, by quantities greater than one (amplification), by quantities less than one (attenuation), by zero (no connection), or by one (a wire connection). For convenience, each modulating element 200-i is drawn in block form with the designation $R_i$.

When the FIG. 1 circuit is used as a signal detector, an input signal $U_n$ from a signal source 500 is also applied to summer 300. The signal $U_n$ represents the input signal at time $n$. Summer 300 is a conventional summer performing nonmodulo addition. Nonmodulo addition is conventional addition, e.g., $4 + 7 = 11$, while modulo addition ignores overflows, e.g., $4 + 7 = 1$ (modulo 10). The output signal of summer 300 at time n is a signal $X_n$. The signal $X_n$ comprises the input signal of the first delay stage of the shift register (delay stage 100-1). Additionally in FIG. 1, the output signals of delay stages 100-1 through 100-k are connected to a transversal filter network 400. The output signal of network 400 comprises the output signal of the circuit of FIG. 1.

For convenience, the output signals of all delay stages are indicated to be connected to filter network 400. It is possible, however, that for particular implementations of the circuit of FIG. 1, some delay stage outputs need not be connected to network 400. In fact, network 400 may be totally superfluous in certain applications and may, therefore, be eliminated. In such applications, the filter's output signal may be derived from the output signal of summer 300 or from the output of any delay stage.

From a perusal of the circuit in FIG. 1 it can be observed that the signal $X_n$ at the output of summer 300 can mathematically be expressed by the relation $$X_n = \sum_{i=1}^{k} R_i X_{n-i} + U_n \quad (1)$$

where $X_{n-i}$ is the output signal at time $n$ of delay stage 100-i. It can be shown that the general solution to equation (1) is $$X_n = \sum_{w=0}^{n} \sum_{i=1}^{k} b_i \rho_i^{n-w} U_w \quad (2)$$

where $P_1, P_2, \ldots P_k$ are distinct roots of the characteristic equation $$F(\lambda) = \lambda^k - \sum_{i=1}^{k} R_i \lambda^{k-i}, \quad (3)$$

and where $b_1, b_2, \ldots b_k$, are complex constants which are a function of the roots $P_1, P_2, \ldots P_k$.

The input signal $U_n$, in its most general form, may be a sum of sine and cosine signals of many frequencies. However, since the circuit of FIG. 1 is linear, the principles of superposition apply, and therefore, no generality is lost by evaluating the FIG. 1 circuit's performance in response to an input signal having only one pair of sine and consine signals of a particular frequency. Assuming, therefore, that $$U_n = A \sin(2\pi f\tau n) + B \cos(2\pi f\tau n) \quad (4)$$

where $f$ is the frequency of the input signal and $\tau$ is the period of the shift register's clock and the period at which the input signal is sampled, equation (2) may be rewritten to yield $$X_n = \sum_{w=0}^{n} \sum_{i=1}^{k} b_i \rho_i^{n-w}(A \sin 2\pi f\tau w + B \cos 2\pi f\tau w). \quad (5)$$

For a given $i$ ($i=m$), the second summation in equation (5) disappears, resulting in a simplified equation (5) which can be expressed as $$X_n = \rho_m^n \sum_{w=0}^{n} |\rho_m|^{-w} [E\, e^{j2\pi f\tau - \theta_m w} + F\, e^{-j2\pi f\tau - \theta_m w}], \quad (6)$$

where $\theta_m$ is the argument of the root $\rho_m$ and where $E$ and $F$ are complex constants dependent on $A$, $B$, and $b_m$. Performing the summations indicated in equation (6), the signal $X_n$ can be expressed as:

$$\begin{aligned} X_n = &\; \rho_m^n\, E\{1-[|\rho_m|^{-1}\exp j(2\pi f\tau-\theta_m)]^{n+1}\}/\{1-\lambda \\ & |\rho_m|^{-1}\exp j(2\pi f\tau-\theta_m)\} \; + \\ & \rho_m^n F\{1-[|\rho_m|^{-1}\exp j(-2\pi f\tau-\theta_m)]^{n+1}\}/\{1-\lambda \\ & |\rho_m|^{-1}\exp j(-2\pi f\tau-\theta_m)\}, \end{aligned} \quad (7)$$

as long as the term $|\rho_m|^{-1}\exp j(\pm 2\pi f\tau-\theta_m)$ is not equal to 1. When $|\rho_m|^{-1}\exp j(\pm 2\pi f\tau-\theta_m)$ is equal to 1 (i.e. $|\rho_m|=1$ and $\theta_m = \pm 2\pi f\tau$ modulo $2\pi$), equation (6) degenerates to $$X_n = (E+F)(n+1). \quad (8)$$

From equation (7) it can be seen that when $|\rho_m| > 1$, $X_n$ increases without bound with increased $n$ and is therefore unstable. When $|\rho_m| < 1$, equation (7) indicates that $X_n$ is bounded at all frequencies. It can be shown that this is not the optimum method for the detection of single frequencies. What is left, then, is $|\rho_m|=1$.

When $|\rho_m|=1$ and the input frequency is such that $\theta_m = 2\pi f\tau$ modulo $2\pi$, the signal $X_n$ increases in accordance with equation (8). When $|\rho_m| = 1$ but the input frequency is such that $\theta_m \neq 2\pi f\tau$ modulo $2\pi$, then equation (7) reduces to $$\begin{aligned} X_n = &\; \rho_m^n\, E[1 - \exp j(2\pi f\tau-\theta_m)^{n+1}]/[1 - \\ & \exp j(2\pi f\tau-\theta_m)]+\rho_m^n\, F[1 - \exp j(-2\pi f\tau-\theta_m) \\ & {}^{n+1}]/[1 - \exp j(-2\pi f\tau-\theta_m)] \end{aligned} \quad (9)$$

which is bounded by $$2E/[1-\exp j(2\pi f\tau-\theta_m)]+2F/[1-\exp j(-2\pi f\tau-\theta_m)], \quad (10)$$

and is independent of $n$. Equations (8), (9), and (10) indicate that even when $|\rho_m|=1$, if the input frequency is such that $\theta_m \neq \pm 2\pi f\tau$ modulo $2\pi$, no resonance occurs, (and no detection occurs) but when both conditions are satisfied, namely $|\rho_m|=1$ and $\theta_m =\pm 2\pi f\tau$ modulo $2\pi$, then a resonance does occur. In the context of this description, the term resonance refers to the condition that at a particular frequency, $X_n$ increases without bound as an $n$ increases (equation 8). The resonance (and detection) which occurs when $|\rho_m| = 1$, occurs for input signals having a frequency $f$ which satisfies the requirement $2\pi f\tau = \pm\theta_m$ modulo $2\pi$. Because of the $2\pi$ modulo, resonance actually occurs at a plurality of frequencies, i.e., $$\pm\frac{\theta_m}{2\pi\tau},\; \pm\frac{\theta_m}{2\pi\tau}\pm\frac{1}{\tau},\; \pm\frac{\theta_m}{2\pi\tau}\pm\frac{2}{\tau}.$$

This is the first source of multiple resonances in the circuit of FIG. 1. This multiple resonance source is generally referred to as aliasing.

From the foregoing, no condition arises which requires the existance of only a single root that satisfies the two resonance requirements. In fact, all of the roots $\rho_i$ of equation (2) may satisfy the two resonance requirements, though not at the same frequencies. For example, a root $\rho_m$ may cause resonance at frequencies $$f = \pm \frac{\theta_m}{2\pi\tau} \text{ (modulo } 2\pi\text{)},$$

while a root $p_j$ may cause resonances at frequencies $$f = \pm \frac{\theta_j}{2\pi\tau} \text{ (modulo } 2\pi\text{)}.$$

The existance of multiple resonating roots is the second source of multiple resonances in the circuit of FIG. 1.

since the argument $\theta$ of a resonating root can equal $+2\pi f\tau$ or $-2\pi f\tau$, the circuit of FIG. 1 possesses an intrinsic frequency ambiguity because it cannot distinguish between the frequency $f$ and the frequency $(1/\tau)-f$. This occurs because $2\pi[(1/\tau)-f]\tau = -2\pi f\tau+2\pi$, which equals $-2\pi f\tau$ modulo $2\pi$. This ambiguity, which is a third source of multiple resonances in the circuit of FIG. 1, (also known as foldover) can actually be used to an advantage. Since for every resonating root $\rho_m = e^{j\theta}$ m, a resonance exists at a frequency $$f = + \frac{\theta_m}{2\pi\tau}$$

and at a frequency $$f = - \frac{\theta_m}{2\pi\tau},$$

another root $\rho_n$ that is a complex conjugate of root $\rho_m$ ($\rho'_m = e^{-j\theta}$ m) introduces no new resonances. As a consequence, if minimization of the number of resonant frequencies is a desirable objective, formation of a characteristic equation for the circuit of FIG. 1 with complex conjugate roots is advantageous because the factor of the characteristic polynomial comprised of a complex root along with its conjugate root has real coefficients. Thus, when each complex root of the characteristic polynomial is accompanied by its conjugate root, the polynomial possesses only real coefficients and the implementation of the FIG. 1 circuit is thus simplified. Further simplification is possible if the characteristic equation of the FIG. 1 circuit can be made to possess only integer real coefficients. This further simplification results from the possible replacement of the $R_i$ multiplications defined by equation (1) with $R_i$-many additions. Adders are generally less complex than multipliers, and adders are generally more accurate than multipliers. It is shown below that a characteristic equation with integer coefficients is possible to achieve.

Figure 2:
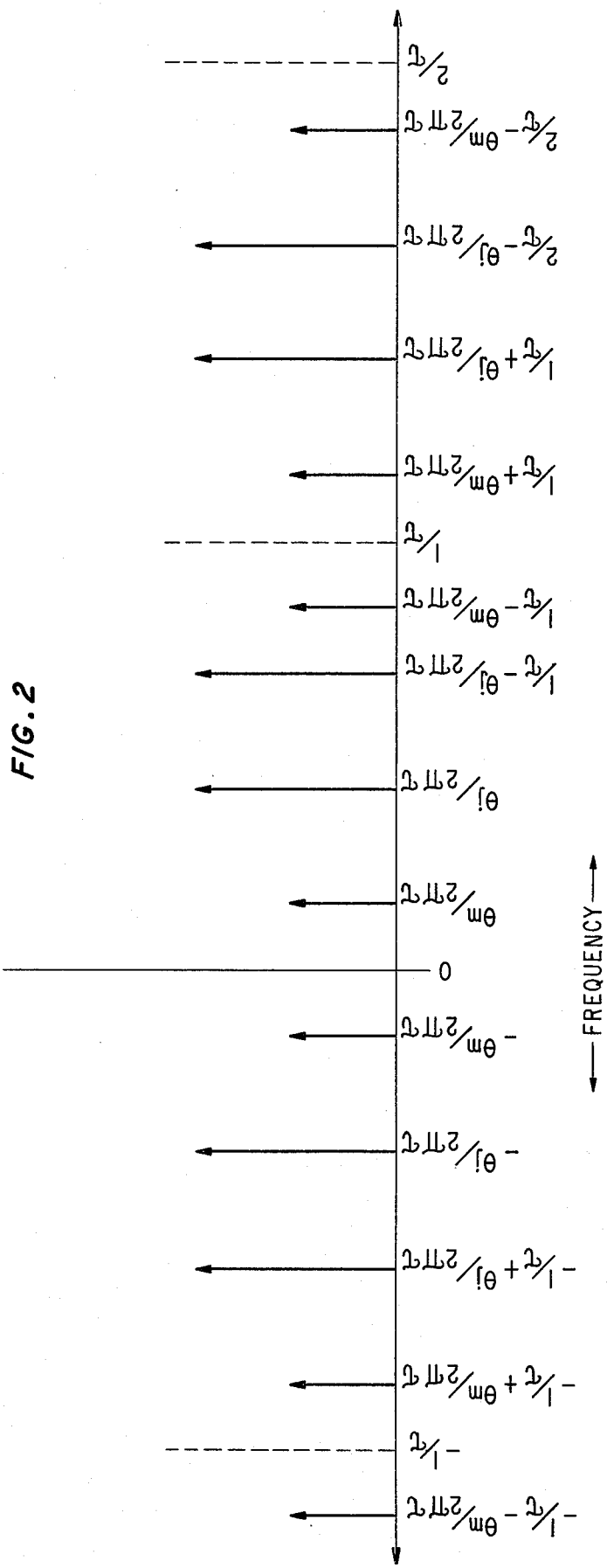
FIG. 2 illustrates the various spurious resonances present in the circuit of FIG. 1 when the circuit contains two resonating poles.

FIG. 2 illustrates the resonances present in the circuit of FIG. 1 when two roots, $\rho_m$ and $\rho_j$, in the characteristic equation of equation (3) satisfy the resonance requirements. The two primary resonances occur at frequencies $$f = \frac{\theta_m}{2\pi\tau}, \text{ and } f = \frac{\theta_j}{2\pi\tau}.$$

All other resonances shown in FIG. 2 are the foldover and aliasing resonances of the two roots. The conjugate (foldover) resonances always occur at frequencies which are also aliasing resonances.

From the above it can be summarized that it is advantageous to have a characteristic equation (3) which possesses the following features:

1. To insure stability, no roots $\rho_m$ should have a magnitude greater than 1.
2. At least one root $\rho_m$, must have a magnitude $|\rho_m| = 1$ in order to allow the circuit of FIG. 1 to resonate at some frequencies.
3. Only a few roots should satisfy the condition $|\rho_m| = 1$, in order that the number of multiple root resonances should be reduced.
4. All roots $\rho_m$ should occur in complex conjugate pairs to insure real coefficients in the characteristic equation.
5. The roots $\rho_m$ can, and should be chosen to yield a characteristic equation having integer coefficients, in order to simplify implementation of the FIG. 1 circuit and to reduce arithmetic errors therein.

With a view towards satisfying the above conditions it can be shown that the equation (3) polynomial, having the restriction that all $R_i$'s are integers and that all roots $\rho$ satisfy the relationship $|\rho| < 1$, must be a cyclotomic polynomial.

A cyclotomic ("circle-dividing") polynomial of order $m$, denoted $F_m(\lambda)$, is defined as a polynomial with integer coefficients, all of whose roots are primitive $m^{th}$ roots of unity (that is, $r^m = 1$, and $r^n \neq 1$ for $0 < n < m$). From this definition, it can be explicitly determined that $$F_m(\lambda) = \pi (\lambda - e^{j2\pi \frac{d}{m}})$$  (11)

where the product is taken over all $d$'s occurring in the range $1 \leq d < m$, such that $d$ and $m$ are relatively prime. The number of $d3$ s determines the degree of the $F_m(\lambda)$ polynomial. The number of $d$'s within the range is found by evaluating the Euler function $\phi(m)$ and adding 1 to the result. The Euler function $\phi(m)$ is defined, in fact, as an integer equal to the number of positive integers less than or equal to m and having no integer factors, other than 1, common to $m$ (such integers are said to be relatively prime to $m$). When m is writen as a product of powers of prime $$m = \pi_{k=1}^{N} p_k^{\alpha_k}$$  (12)

it can be shown that $$\phi(m) = \sum_{k=1}^{N} [p_k^{\alpha_k -1}][p_k-1].$$  (13)

For example, if $m = 30$, $\phi(m) = 7$ and thus the number of numbers relatively prime to 30 is 8. Indeed, the numbers that are relatively prime to 30 are 1, 7, 11, 13, 17, 19, 23, and 29. This list does contain exactly 8 numbers. In view of equation (13), the function $F_m(\lambda)$ of equation (11) can be rewritten as $$F_m(\lambda) = \prod_{\nu=1}^{p(m)} [\lambda - \exp j(2\pi d_\nu /m)]. \quad (14)$$

For $m = 30$, equation (14) can be rewritten as, $$F_{30}(\lambda) = (\lambda - e^{j\frac{2\pi}{30}})(\lambda - e^{j\frac{2\pi 7}{30}})(\lambda - e^{j\frac{2\pi 11}{30}})(\lambda - e^{j\frac{2\pi 13}{30}})$$
$$(\lambda - e^{j\frac{2\pi 29}{30}})(\lambda - e^{j\frac{2\pi 23}{30}})(\lambda - e^{j\frac{2\pi 19}{30}})(\lambda - e^{j\frac{2\pi 17}{30}}). \quad (15)$$

Note that all roots appear in complex conjugate pairs, i.e.

$$e^{-j\frac{2\pi 29}{30}} = e^{j\frac{2\pi}{30}},$$

which is the complex conjugate of $$e^{j\frac{2\pi}{30}}.$$

Conversion of equation (14) to cartesian coordinates yields $$F_{30}(\lambda) = \lambda^8 + \lambda^7 - \lambda^5 - \lambda^4 - \lambda^3 + \lambda + 1 \quad (16)$$

with the expected real integer coefficients. Interestingly, all the coefficients of $f(\lambda)$ are either +1, −1, or zero.

As illustrated by the above example, cyclotomic polynomials, happily, make very desirable characteristic polynomials because of their extreme simplicity. For example, for $k < 105$, or for a $k$ that is a product of two prime numbers, the coefficients of $F(\lambda)$ are all 0 or ±1. For a $k$ that is a power of a single prime, the coefficients are all 0 and +1; and for $k < 385$, the coefficients do not exceed 2 in absolute value. This means, of course, that in all cases of practical interest, the $R_i$ coefficients of equation (3) will be 0 and ±1; which means that there is either no connection ($R_i = 0$), a direct connection ($R_i = 1$), or a negative connection ($R_i = -1$) in the circuit characterized by equation (3), i.e., in the circuit of FIG. 1.

In view of the above, the characteristic equation of the circuit of FIG. 1 should most advantageously be a cyclotomic polynomial. In accordance with the principles of this invention, therefore, the characteristic function of the FIG. 1 circuit is a cyclotomic polynomial. What remains, then, is the selection of the particular cyclotomic polynomial that is suitable for a desired application.

The roots of cyclotomic polynomials of order m lie on the unit circle and have the form $\exp(j2\pi d_\nu /m)$ as shown by equation (14). The set of $d_\nu$'s are relatively prime to m, and there are $\phi(m)$ such $d_\nu$'s. There are, therefore, $\phi(m)$ multiple root primary resonances, $\phi(m)$ foldover resonances and a set of aliasing resonances associated with each primary resonance. Since the number $d_\nu = 1$ corresponds to the lowest primary resonance frequeny $2\pi f\tau = 2\pi/m$, it is best to select this resonance frequency as the frequency of the signal to be detected. Detection of all other frequencies would then be considered spurious and unwanted. It is desirable, therefore, to select a cyclotomic filter having all spurious resonances out of the frequency band of expected input signals.

If resonance at the primary frequency is described by $2\pi f_o\tau = 2\pi/m$ and if the circuit of FIG. 1 is implemented with $k$ delay stages where $k = \phi(m)$, then the sampling rate of the input frequency and the clock rate of the filter must be $1/\tau = f_o m$. Since the primary resonance is chosen for $d_\nu = 1$, all other resonances occur at harmonies of the primary resonance $f_o$. These resonances occur at the harmonies which correspond to the $d_\nu$ numbers. For example, for $m = 30$ ($k = 8$), the spurious resonances due to the multiple roots occur at $7f_o$, $11f_o$, $13f_o$, $17f_o$, $19f_o$, $23f_o$, and $29f_o$; the lowest frequency spurious aliasing resonance $$(\text{at} - \frac{\theta m}{2\pi\tau} + \frac{1}{\tau})$$

occurs at $29f_o$; and the lowest frequency spurious foldover resonance (contributed by $23f_o$) occurs at $7f_o$. The foldover resonance due to $f_o$ occurs at $29f_o$.

Figure 3:
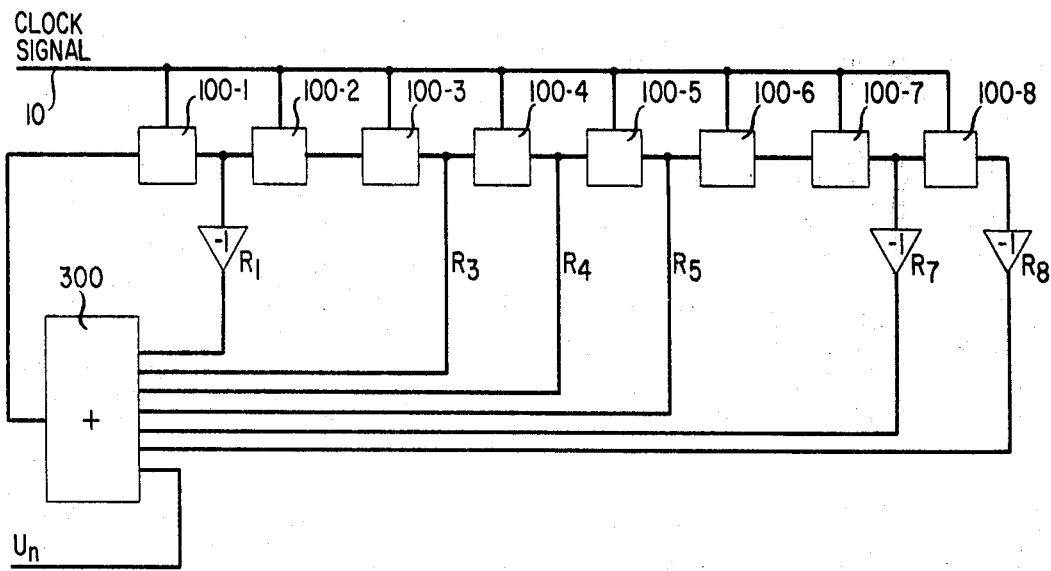
FIG. 3 depicts a FIG. 1 circuit that is specifically designed to possess a characteristic function that is an order 30 cyclotomic polynomial.

In the above example, the first spurious resonance occurs at $7f_o$. If the input signal $U_n$ is bandlimited to less than $7f_o$, then the choice of a cyclotomic polynomial of order 30 would be quite judicious. Under such circumstances, the filter circuit of FIG. 1 is constructed with eight delay stages and with modulating elements' values as determined by equating the coefficients of equations (3) and (17). Specifically, setting $\lambda^8 - R_1\lambda^7 - R_2\lambda^6 - R_3\lambda^5 - R_4\lambda^4 - R_5\lambda^3 - R_6\lambda^2 - R_7\lambda^1 - R_8$ of eq. (3) equal to $\lambda^8 + \lambda^7 - \lambda^5 - \lambda^4 - \lambda^3 + \lambda + 1$ of eq. (16) yields $R_1 = -1$, $R_2 = 0$, $R_3 = 1$, $R_4 = 1$, $R_5 = 1$, $R_6 = 0$, $R_7 = -1$, and $R_8 = -1$. FIG. 3 illustrates a partial implementation of the circuit of FIG. 1 in accordance with the above specification for an order 30 cyclotomic characteristic polynomial. This circuit, whose output signal appears at the output of summer 300, is well suited for detecting signals that are bandlimited to $7f_o$.

As has already been indicated, it is desirable to have as few spurious resonances as possible. On the other hand, the self-imposed limitation of integer coefficients restricts the characteristic function of the FIG. 1 circuit to the class of cyclotomic polynomials, all of whose roots resonate. It is, therefore, desirable to either select a cyclotomic polynomial of a low order, yielding few resonating roots, or to select a cyclotomic polynomial of a high order and to negate the effect of the spurious resonances. In many applicatons, the latter approach is preferable.

In attempting to negate the effect of spurious resonances, it should be observed that for a FIG. 3 circuit having a cyclotomic polynomial characteristic function, the transfer function of the circuit can be expressed by $$H(\lambda) = 1 / \prod_{\nu=1}^{\phi(m)} [\lambda - \exp j(2\pi d_\nu /m)] \quad (17)$$

where, associated with each pole in equation (17) there exists another pole in equation (17) which is a complex conjugate of the first pole. Although the poles are inherent in and cannot be eliminated from the characteristic polynomial, it is possible to negate the effect of unwanted resonances by the introduction of appropriate transmission zeros in the overall transfer response of the circuit of FIG. 1. Accordingly, the illustrative embodiment shown in FIG. 1 includes a transversal filter network 400, connected to appropriate delay elements 100-1 through 100-k. Network 400 provides the necessary transmission zeros.

Conceivably, network 400 can eliminate all unwanted resonances by introducing zeros at all but the first pole of equation (16). It is preferable, however, to choose a network 400 which includes only real zeros, or pairs of complex conjugate zeros, and which therefore possesses a characteristic polynomial of only real coefficients. One such preferable transfer function has the form $$Z(\lambda) = \prod_{\nu=2}^{(\phi(m)-1)} [\lambda - \exp \frac{j2\pi d}{m}\nu]. \quad (18)$$

Generally, the coefficients of $Z(\lambda)$ are not integers. Rounding-off the coefficients to the nearest integer, however, causes only slight degradation to the circuit's attenuation of unwanted resonance frequencies. Accordingly, in its simplest form, the transversal network 400 of FIG. 1 possesses a transfer function expressed by a polynomial having real integer coefficients, which polynomial most closely approximates the polynomial of equation (18). For example, the performance of the circuit of FIG. 3 may be improved to widen the allowable bandwidth of the input signal from $7f_o$ to $29f_o$ by including in FIG. 3 a transversal network having a transfer function of the form $$Z(\lambda) = (\lambda - e^{\frac{j2\pi 7}{30}})(\lambda - e^{\frac{j2\pi 11}{30}})(\lambda - e^{\frac{j2\pi 13}{30}})$$
$$(\lambda - e^{\frac{j2\pi 23}{30}})(\lambda - e^{\frac{j2\pi 19}{30}})(\lambda - e^{\frac{j2\pi 17}{30}}), \quad (19)$$

which when converted to cartesian coordinates, simplified, and rounded off to provide integer coefficients, can be expressed by $$Z(\lambda) = 6 + 3\lambda^5 + 5\lambda^4 + 5\lambda^3 + 5\lambda^2 + 3\lambda + 1. \quad (20)$$

Structurally, equation 10 indicates that the output signal of transversal network 400, $Y_n$, which is the output signal of the detector circuit, is developed by multiplying the output signal of each delay element in the shift register, $x_{n-i}$, by a constant $c_i$ and summing the result so that the transfer function of equation 19 is achieved. That is, $$Y_n = \sum_{i=1}^{k} c_i x_{n-i}. \quad (21)$$

Figure 4:
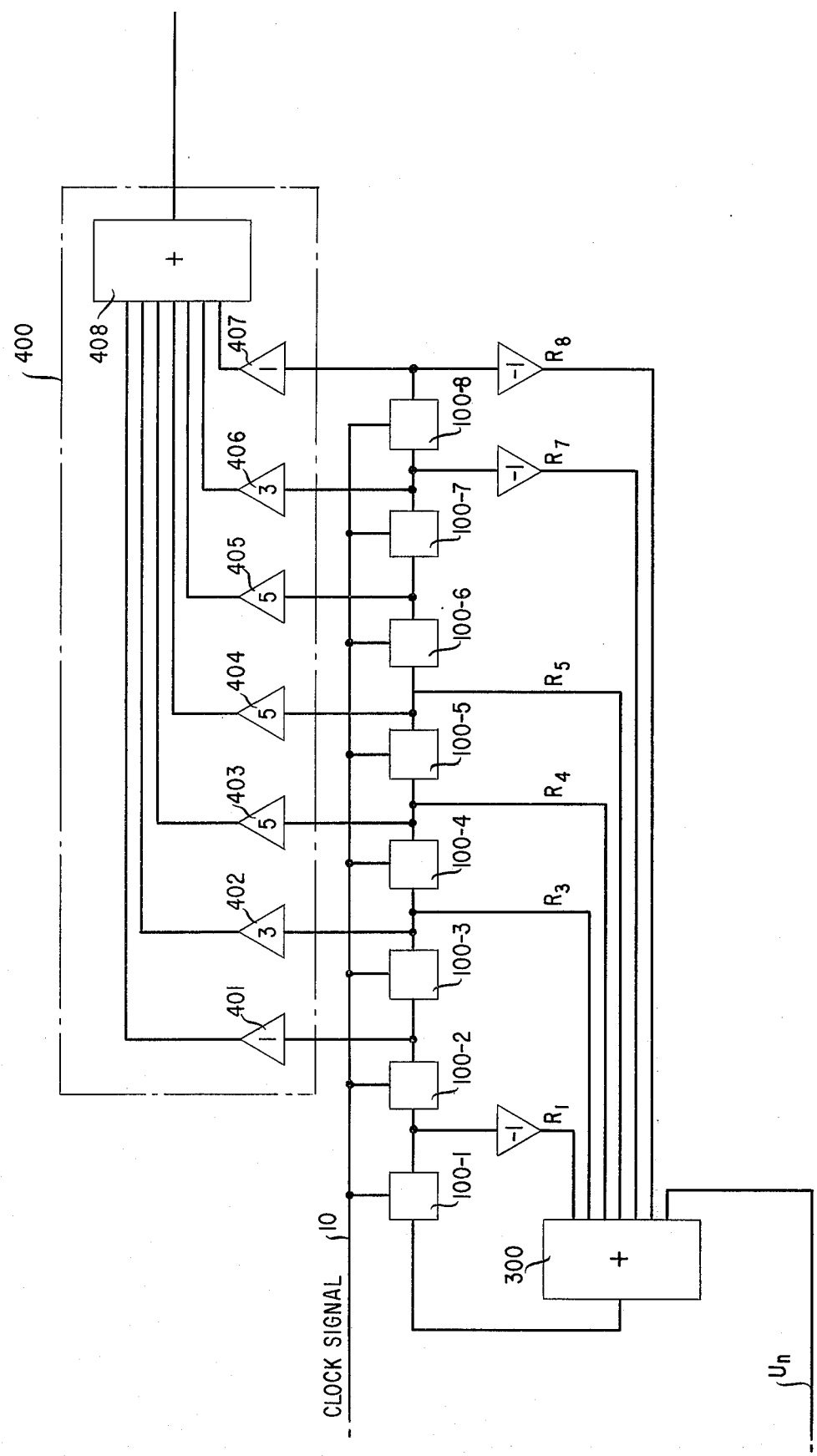
FIG. 4 depicts the circuit of FIG. 3 with an appended transversal filter 400 designed to substantially negate the spurious resonances present in the circuit of FIG. 3.

In the case above, exemplified by equation (20), $c_1 = 0$, $c_2 = 1$, $c_3 = 3$, $c_4 = c_5 = c_6 = 5$, $c_7 = 3$, and $c_8 = 1$. FIG. 4 illustrates the circuit of FIG. 3 with a transversal network 400 as characterized by equation (20). In FIG. 4, the transversal network 400 realizes the expression defined by equation (20) with amplifiers 401 through 407 connected to the appropriate delay stages, and with an adder 408, responsive to the output signals of amplifiers 401–407, which develops the output signal of the circuit. Alternatively, amplifiers 401 through 407 may be replaced with appropriately scaled resistors or with an adder 408 which has more than one of its inputs connected to a particular delay stage output.

When the input signal $U_n$ contains a signal of a frequency equal to the resonance frequency of the circuit, as previously indicated, the output of summer 300 increases in accordance with equation (8) and the output signal of transversal filter 400 follows accordingly. Whether resonance exists or not is determined by comparing the circuit's output signal, after a predetermined time interval, with a fixed threshold signal. A compared output signal greater than the threshold signal indicates that the input signal does contain a signal of frequency equal to the resonance frequency of the detector circuit. Alternatively, the comparing may be done at regular time intervals by setting the shift register to zero after every comparison.

For convenience, Table 1 is provided to show cyclotomic polynomials up to and including order 30 which are useful in the utilization of this invention. Also shown are the corresponding polynomials for the transversal network.

TABLE 1

| Characteristic Polynomial | Transversal Network Polynomial (Rounded) |
|---|---|
| $F_2 = \lambda + 1$ | — |
| $F_3 = \lambda^2 + \lambda + 1$ | — |
| $F_4 = \lambda^2 + 1$ | — |
| $F_6 = \lambda^2 - \lambda + 1$ | — |
| $F_8 = \lambda^4 + 1$ | $1 + \lambda + \lambda^2$ |
| $F_{12} = \lambda^4 - \lambda^2 + 1$ | $1 + 2\lambda + \lambda^2$ |
| $F_9 = \lambda^6 + \lambda^3 + 1$ | $1 + 2\lambda + \lambda^2 + 2\lambda^3 + \lambda^4$ |
| $F_{18} = \lambda^6 - \lambda^3 + 1$ | $1 + 2\lambda + 3\lambda^2 + 2\lambda^3 + \lambda^4$ |
| $F_{15} = \lambda^8 - \lambda^7 + \lambda^5 - \lambda^4 + \lambda^3 - \lambda + 1$ | $1 + \lambda + \lambda^2 + \lambda^3 + \lambda^4 + \lambda^5 + \lambda^6$ |
| $F_{16} = \lambda^8 + 1$ | $1 + 2\lambda + 2\lambda^2 + 3\lambda^3 + 2\lambda^4 + 2\lambda^5 + \lambda^6$ |
| $F_{24} = \lambda^8 - \lambda^4 + 1$ | $1 + 2\lambda + 3\lambda^2 + 3\lambda^3 + 3\lambda^4 + 2\lambda^5 + \lambda^6$ |
| $F_{30} = \lambda^8 + \lambda^7 - \lambda^5 - \lambda^4 - \lambda^3 + \lambda + 1$ | $1 + 3\lambda + 5\lambda^2 + 5\lambda^3 + 5\lambda^4 + 3\lambda^5 + \lambda^6$ |

With respect to the use of the disclosed circuit as a signal generator, from a perusal of equation (17) it can be seen that, in response to a unit pulse input signal, also referred to as an initializing signal, the circuit of FIG. 3 oscillates at the frequencies defined by the resonance roots of equation (17). The magnitude of oscillation at each frequency is dependent on the number of resonance frequencies and on the strength of the input signal.

The initializing signal need not be limited to a unit pulse, and can, in fact, be any sequence of input signals. These input signals induce a particular state of initial conditions in the delay elements of the FIG. 3 circuit, and these initial conditions control the magnitude of sustained oscillations which continue when the input signal is removed. Of course, a nonzero initial conditions in the delay elements can be provided by means other than the input signal.

The circuit of FIG. 3 can be made to appear to oscillate at a single frequency by including a transversal filter 400, as in FIG. 4, which possesses transmission zeros at the frequencies of the unwanted oscillations. For oscillator applications, network 400 is implemented in a manner that is completely analogous to the network 400 implementation for signal detection applications.

When sinusoidal oscillations are desired, a second, and in some respects a better, utilization of this invention can be had by observing that if a particular sequence of inputs is applied to the circuit of FIG. 3, sinusoidal oscillation will result. Specifically, the transfer response $H(\lambda)$ has a plurality of resonating poles as shown by equation (18). Since the output signal $X(\lambda)$ can be expressed by $$X(\lambda) = H(\lambda) U(\lambda), \quad (22)$$

if $U(\lambda)$ is made to contain zeros at the undesired poles, (i.e., if $U(\lambda)$ is identical to $Z(\lambda)$ of equation (19)) then $X(\lambda)$ would contain only a single pair of complex conjugate poles and $X_n$ would be periodic and sinusoidal, with a frequency corresponding to the frequency of the remaining pole in $X(\lambda)$.

Heretofore, the circuit operation for the illustrative embodiments of this invention has been described for arbitrary input signals, $U_n$. It may be observed, however, that by choosing an appropriate cyclotomic polynomial and by choosing an appropriately designed transversal filter 400, the input signal $U_n$ may be "hard clipped" following bandlimiting (to +1 for positive inputs and to −1 for negative inputs) without adversely affecting the circuits' operation. The reason for this insensitivity to hard clipping may be understood by observing that if the first spurious resonance of the circuit of FIG. 1 appears at $m_1 f_0$ (where $f_0$ is the signal sought to be detected), and if $U_n$ is previously bandlimited not to contain signals above $m_2 F_0$, then only harmonic numbers greater than $m_1/m_2$ can possibly be erroneously detected. For example, consider a signal bandlimited to $2f_0$ as the input signal to the circuit of FIG. 4. Since the first spurious resonance of that circuit is at $29f_0$, the $15^{th}$ harmonic of the input signal would be the lowest harmonic that could possibly be detected. A signal that could provide such a $15^{th}$ harmonic is a signal of frequency $f_1 \leq (29/15) f_0$. Although a hard clipped input signal $U_n$ generates harmonics which extend beyond the $15^{th}$ harmonic, the magnitude of such harmonics is s low (<8.5 percent of the fundamental) that spurious detections present no problem.

It should be observed that the structure of the FIG. 1 circuit is applicable to both analog and digital implementations. In an analog implementation, the delay elements are analog delay elements, such as CCD's, the modulating elements are analog, and the adders are also analog. In a digital implementation, the delay elements are digital registers (binary or otherwise), the modulating elements are digital complementing circuits, and the adders are digital adders.

It should further be observed that the hard limited input signals, when modified by converting the −1 signals to logic 0 signals, can be directly applied to a digital implementation of the FIG. 1 circuit without the use of A/D converters. The use of input signal hard clipping affords an additional advantage over the nonclipped input signals in that it is possible to predict the maximum signal that the FIG. 1 circuit can generate. This predictability allows for efficient hardware design. In digital implementations, for exaple, this predicability provides a measure of the necessary size of registers and adders. In analog implementations, this predictability provides a measure of the required dynamic range of the analog components.

In some applications it may prove beneficial to quantize the signals circulating within an analog implementation of the FIG. 1 circuit so that errors (e.g., due to CCD losses) do not accumulate. Such quantization may, for example, be accomplished by interposing a quantizer between summer network 300 and the first delay element 100-1. The quantizer may comprise, for example, a plurality of voltage comparators with one input of each connected to the output of summer network 300 and the other input of each connected to various threshold voltages. The output currents of the voltage comparators may be summed and applied to a resistor to provide the necessary quantizer output signals.

Although a particular signal has been described in detail, it should be understood that, in some configurations, any available signal can serve as the circuit's output signal.

What is claimed is:

1. A signal detection circuit comprising:
a shift register;
means for multiplying the output signals of selected stages of said shift register by predetermined integers to cause the characteristic function of said circuit to be a cyclotomic polynomial;
means for forming a non-modulo sum of an input signal and of said integer multiplied signals; and
means for applying said sum to the first stage of said shift register.

2. A circuit comprising:
a shift register of k stages;
means for forming product signals $R_i X_{n-i}$ where $X_{n-i}$ is the output signals of the $i^t$ stage of said shift register at time $n$ and $R_i$ is a predetermined multiplicative integer associated with the $i^{th}$ stage of said shift register, such that for a function variable $\lambda$, the function $$F(\lambda) = \lambda^k - \sum_{i=1}^{k} R_i \lambda^{k-i}$$

is a cyclotomic polynomial;
means for developing a signal $U_n$;
means for adding said product signals with said signal $U_n$ to form a signal $$X_n = \sum_{i=1}^{k} R_i X_{n-i} + U_n;$$

and
means for applying said $X_n$ signal to the first stage of said shift register.

3. The circuit of claim 2 wherein said $k$ equals 2 and said $F(\lambda)$ equals $\lambda^2 - \lambda + 1$.

4. The circuit of claim 2 wherein said $k$ equals 4 and said $F(\lambda)$ equals $\lambda^4 - \lambda^2 + 1$.

5. The circuit of claim 2 wherein said $k$ equals 6 and said $F(\lambda)$ equals $\lambda^6 - \lambda^3 + 1$.

6. The circuit of claim 2 wherein said $k$ equals 8 and said $F(\lambda)$ equals $\lambda^8 + \lambda^7 - \lambda^5 - \lambda^4 - \lambda^3 + \lambda + 1$.

7. The circuit defined in claim 2 wherein said means for developing a signal $U_n$ is a unit pulse generator.

8. The circuit defined in claim 2 wherein said means for developing a signal $U_n$ develops a signal $U_n$ that is nonzero for a predetermined finite duration and is zero thereafter.

9. The circuit defined in claim 2, further comprising a transversal network connected to selected delay elements of said shift register for developing a signal $$Y_n = \sum_{i=1}^{k} C_i X_{n-i}$$

where $X_{n-i}$ is the output signal of the $i^{th}$ stage of said shift register at time $n$ and the $C_i$'s are preselected integers.

10. A circuit comprising:
a shift register of $k$ stages having at least one of said $k$ stages at a nonzero initial condition;
means for forming product signals $R_i X_{n-i}$ where $X_{n-i}$ is the output signals of the $i^{th}$ stage of said shift register at time $n$ and $R_i$ is a predetermined multiplicative integer associated with the $i^{th}$ stage of said shift register, such that for a function variable $\lambda$, the function $$f(\lambda) = \lambda^k - \sum_{i=1}^{k} R_i \lambda^{k-i}$$

is a cyclotomic polynomial;
means for adding said product signals with $U_n$ an input signal to form a signal $$X_n = \sum_{i=1}^{k} R_i X_{n-i} + U_n ;$$

means for applying said $X_n$ signal to the first stage of said shift register; and
a transversal network connected to selected stages of said shift register for developing a signal $$Y_n = \sum_{i=1}^{k} C_i x_{n-i}$$

where $x_{n-i}$ is the output signal of the $i^{th}$ stage of said shift register at time $n$ and the $C_i$'s are preselected integers.

11. The apparatus of claim 10 wherein said $C_i$'s are preselected multiplicative real constants such that said signal $Y_n$ possesses transmission zeroes at some of the roots of said cyclotomic polynomial.

12. The circuit defined in claim 11 wherein said $C_i$'s are rounded off to a prechosen accuracy.

13. The circuit defined in claim 11 wherein said $U_n$ is hard clipped.

14. A signal generator developing a clocked signal having a desired frequency comprising:
a shift register;
means for multiplying the output signals of selected stages of said shift register by predetermined integers to cause the characteristic function of said circuit to be a cyclotomic polynomial;
means for forming a non-modulo sum of said integer multiplied signals and an input signal sequence of fixed duration having transmission zeros at all the roots of said cyclotomic polynomial except at the roots corresponding to said desired frequency; and
means for applying said sum to the first stage of said shift register.

* * * * *

UNITED STATES PATENT AND TRADEMARK OFFICE
CERTIFICATE OF CORRECTION

PATENT NO. : 3,971,998    PAGE 1 OF 3
DATED : July 27, 1976
INVENTOR(S) : Bhaskarpillai Gopinath and Robert P. Kurshan It is certified that error appears in the above-identified patent and that said Letters Patent are hereby corrected as shown below:

Column 2, line 68, "source" should read --generator--.
Column 3, line 45, "$P_1, P_2, \ldots P_k$" should read --$\rho_1, \rho_2, \ldots \rho_k$--;
line 53 "$P_1, P_2, \ldots P_k$" should read --$\rho_1, \rho_2, \ldots \rho_k$--. Column 4 line 10, equation (6) should read $$--X_n = \rho_m^n \sum_{w=0}^{n} |\rho_m|^{-w} [E\, e^{j(2\pi f\tau - \Theta_m)w} + F\, e^{j(-2\pi f\tau - \Theta_m)w}]; \quad (6)--;$$

lines 20, 21, 22, 23, equation (7) should read $$--X_n = \rho_m^n\, E\{1 - [|\rho_m|^{-1} \exp j(2\pi f\tau - \Theta_m)]^{n+1}\}$$
$$/[1 - |\rho_m|^{-1} \exp j(2\pi f\tau - \Theta_m)] +$$
$$\rho_m^n F\{1 - [|\rho_m|^{-1} \exp j(-2\pi f\tau - \Theta_m)]^{n+1}\}$$
$$/[1 - |\rho_m|^{-1} \exp j(-2\pi f\tau - \Theta_m)] \quad (7)--;$$

lines 44, 45, 46, equation (9) should read $$--X_n = \rho_m^n\, E[1 - \exp j(2\pi f\tau - \Theta_m)^{n+1}]/[1 - \exp j(2\pi f\tau - \Theta_m)] +$$
$$\rho_m^n\, F[1 - \exp j(-2\pi f\tau - \Theta_m)^{n+1}]/[1 - \exp j(2\pi f\tau - \Theta_m)] \quad (9)--;$$

the end of line 66 should read --$\frac{2}{\tau}, \ldots$--. Column 5, line 22, "since" should read --Since--. Column 6, line 47, "d3s" should read --d's--; line 58, equation (12) should read $$--m = \prod_{k=1}^{N} p_k^{\alpha_k} \quad (12)--$$

Column 8, line 66, equation (17) should read $$--H(\lambda) = 1 / \prod_{\nu=1}^{\phi(m)} [\lambda - \exp j(2\pi d_\nu/m)] \quad (17)--.$$

UNITED STATES PATENT AND TRADEMARK OFFICE
CERTIFICATE OF CORRECTION

PATENT NO. : 3,971,998

DATED : July 27, 1976

INVENTOR(S) : Bhaskarpillai Gopinath and Robert P. Kurshan

It is certified that error appears in the above-identified patent and that said Letters Patent are hereby corrected as shown below:

Column 9, line 21, equation (18) should read $$Z(\lambda) = \prod_{\nu=2}^{(\phi(m)-1)} [\lambda - \exp \frac{12\pi d}{m} \nu]. \qquad (18)--;$$

line 49, equation (20) should read $$--Z(\lambda) = \lambda^6 + 3\lambda^5 + 5\lambda^4 + 5\lambda^3 + 5\lambda^2 + 3\lambda + 1. \qquad (20)--;$$

line 55, "$X_n \quad 1,$" should read $--x_{n-1},--$; line 60, equation (21) should read $$--Y_n = \sum_{i=1}^{k} c_i \, xn-i. \qquad (21)--.$$

Column 11, line 43, "s" should read --so--; line 63, "exaple" should read --example--. Column 12, line 33, "it" should read $--i^{th}--$; line 47, the formula should read $$X_n = \sum_{i=1}^{k} R_i \, X_{n-i} + U_n.$$

Column 13, line 6, the formula should read $$Y_n = \sum_{i=1}^{k} C_i X_{n-i};$$

line 30, the formula should read $$X_n = \sum_{i=1}^{k} R_i \, X_{n-i} + U_n.$$

Column 14, line 6, the formula should read

UNITED STATES PATENT AND TRADEMARK OFFICE
CERTIFICATE OF CORRECTION

PATENT NO. : 3,971,998
DATED : July 27, 1976
INVENTOR(S) : Bhaskarpillai Gopinath and Robert P. Kurshan It is certified that error appears in the above–identified patent and that said Letters Patent are hereby corrected as shown below:

$$Y_n = \sum_{i=1}^{k} C_i x_{n-i}.$$

Signed and Sealed this

Twenty-eighth Day of December 1976

[SEAL]

Attest:

RUTH C. MASON
*Attesting Officer*

C. MARSHALL DANN
*Commissioner of Patents and Trademarks*